United States Patent
Lee et al.

(10) Patent No.: US 6,913,963 B2
(45) Date of Patent: Jul. 5, 2005

(54) METHOD FOR FABRICATING CAPACITOR IN SEMICONDUCTOR DEVICE

(75) Inventors: Tae Hyeok Lee, Kyoungki-do (KR); Cheol Hwan Park, Seoul (KR); Dong Su Park, Kyoungki-do (KR); Sang Ho Woo, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/331,422

(22) Filed: Dec. 30, 2002

(65) Prior Publication Data

US 2004/0023456 A1 Feb. 5, 2004

(30) Foreign Application Priority Data

Aug. 5, 2002 (KR) ................................ 10-2002-0046029

(51) Int. Cl.[7] .......................................... H01L 21/8242
(52) U.S. Cl. .................... 438/238; 438/253; 438/287; 438/791
(58) Field of Search ........................... 438/238–240, 438/250–256, 381, 393–399, 787–792, 287

(56) References Cited

U.S. PATENT DOCUMENTS

| | | | |
|---|---|---|---|
| 4,935,661 A | * 6/1990 | Heinecke et al. | 313/231.31 |
| 5,578,848 A | 11/1996 | Kwong et al. | |
| 5,643,819 A | 7/1997 | Tseng | |
| 5,792,693 A | 8/1998 | Tseng | |
| 5,837,578 A | 11/1998 | Fan et al. | |
| 6,004,859 A | * 12/1999 | Lin | 438/398 |
| 6,014,310 A | 1/2000 | Bronner et al. | |
| 6,100,579 A | 8/2000 | Sonoda et al. | |
| 6,146,938 A | * 11/2000 | Saida et al. | 438/239 |

FOREIGN PATENT DOCUMENTS

| | | |
|---|---|---|
| JP | 4277674 | 10/1992 |
| JP | 252365 | 9/2000 |

* cited by examiner

*Primary Examiner*—H. Jey Tsai
(74) *Attorney, Agent, or Firm*—Ladas & Parry LLP

(57) ABSTRACT

A method for fabricating a capacitor for a semiconductor device is disclosed, which comprises the steps of: forming a storage node electrode on a semiconductor wafer, forming a dielectric layer made of a cyclic silicon nitride layer on the surface of the storage node electrode, and forming an upper electrode on the dielectric layer; lowering the thickness $T_{eff}$ of the dielectric layer and improving leakage current characteristics through use of a cyclic $Si_3N_4$ or a cyclic $SiO_xN_y$ (wherein x falls between 0.1 and 0.9 and y falls between 0.1 and 2), having a large oxidation resistance and high dielectric ratio, as a dielectric.

13 Claims, 2 Drawing Sheets

METHOD FOR FABRICATING CAPACITOR IN SEMICONDUCTOR DEVICE

BACKGROUND OF THE INVENTION

1. Field of the Invention

The present invention relates to a method for fabricating a capacitor in a semiconductor device, and more particularly to a method for fabricating a capacitor in a semiconductor device using a cyclic $Si_3N_4$ (or $SiO_xN_y$)

2. Description of the Prior Art

As generally known in the art, as shown in FIG. 1, with regards a conventional N/O ($Si_3N_4/SiO_2$) capacitor, an interlayer insulating layer 11 is deposited on a wafer (not shown) wherein several elements are constructed, and selective patterning of the interlayer insulating layer is performed to thereby form a contact hole (not shown) exposing a part of the semiconductor wafer.

Then, a contact plug 13 is formed in the contact hole (not shown), and a storage node 15 of a cylindrical shape, a concave shape, or another shape, is formed on the surface of the entire resultant structure, and an oxide layer on the surface of the storage node 15 is removed through a pre-cleansing process by using a HF solution.

Next, an $Si_3N_4$ thin layer 17 is deposited through an LPCVD process (an ONO second process), and an oxidation process (an ONO third process) is performed to thereby form an upper electrode 19, resulting in the accomplishment of production of the capacitor.

However, since the cell area decreases due to the decrease of design rule, it is required to reduce the thickness ($T_{eff}$) of the dielectric so as to obtain necessary charging capacity.

With regard to the conventional N/O dielectric, since the oxidation resistance of the $Si_3N_4$ becomes seriously reduced at a thickness below 40 Å due to the LPCVD process, there occur problems in that elements of the semiconductor positioned below the capacitor, such as the storage node and a bit-line, are oxidized at the time of the third ONO process, and it is difficult to lower the thickness $T_{eff}$ of the dielectric below 45 Å, because the leakage current increases and the breakdown voltage decreases at thickness below 50 Å.

SUMMARY OF THE INVENTION

Accordingly, the present invention has been made to solve the above-mentioned problems occurring in the prior art, and an object of the present invention is to provide a method for fabricating a capacitor in a semiconductor device capable of reducing the thickness $T_{eff}$ of the dielectric and improving leakage current characteristics by using an $Si_3N_4$ or an $SiO_xN_y$ (wherein x falls between 0.1 and 0.9 and y falls between 0.1 and 2) as a dielectric.

In order to accomplish this object, there is provided a method for fabricating a capacitor for a semiconductor device, comprising the steps of: forming a storage node electrode on a semiconductor wafer, forming a dielectric layer made of a cyclic silicon nitride on the surface of the storage node electrode, and forming an upper electrode on the dielectric layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
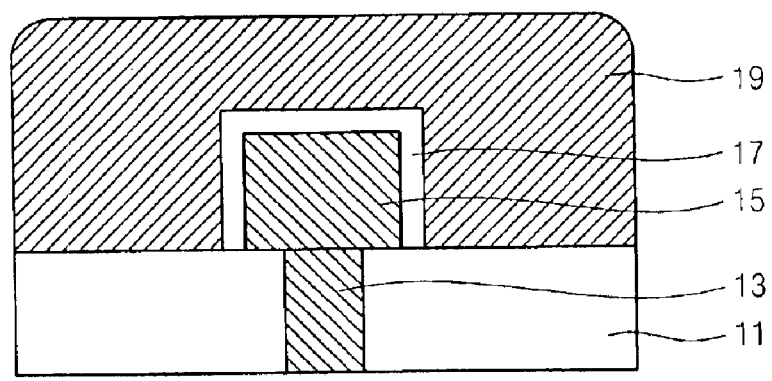
FIG. 1 is a cross-sectional view for illustrating a method for fabricating a capacitor in a semiconductor device in accordance with a conventional art.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
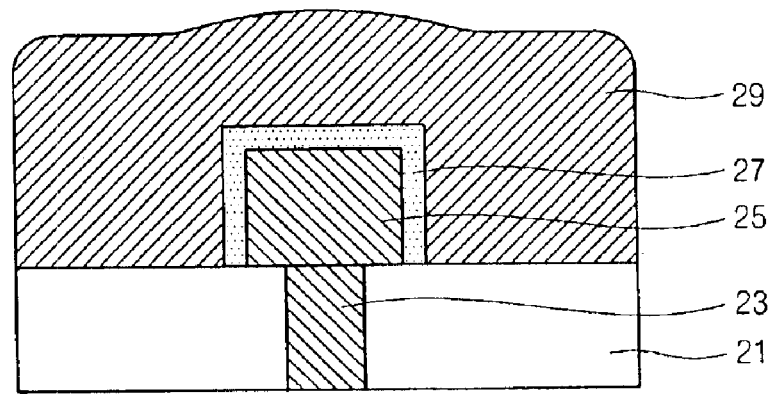
FIG. 2 is a cross-sectional view for illustrating a method for fabricating a capacitor in a semiconductor device in accordance with the present invention.

As shown in FIG. 2, with regards a method for fabricating a capacitor in a semiconductor device in accordance with the present invention, an interlayer insulating layer 21 is deposited on a wafer (not shown) wherein several elements are constructed, and selective patterning of the interlayer insulating layer is performed to thereby form a contact hole (not shown) exposing a part of the semiconductor wafer.

Then, a contact plug 23 is formed in the contact hole (not shown), and a storage node 25 of a cylindrical shape, a concave shape, etc., is formed on the entire surface of the semiconductor wafer.

Next, a dielectric layer 27 made of a cyclic $Si_2N_4$ or a cyclic SiOxNy (where x falls between 0.1 wad 0.9 end y falls between 0.1 and 2) is deposited on the storage node electrode 25. At this time, the storage node electrode 25 is deposited in multi-layers having more than two layers to maximize the phosphorous concentration and to increase the area of the storage node electrode by means of an MPS. That is, an anamorphous layer of the storage node electrode is formed through first depositing a doped amorphous silicon layer having a high dopant concentration in an in-situ manner, and then depositing an amorphous silicon layer having a low dopant concentration by changing amounts of the gas flow while maintaining a semiconductor substrate in the reaction furnace in the in-situ manner.

Figure 3:
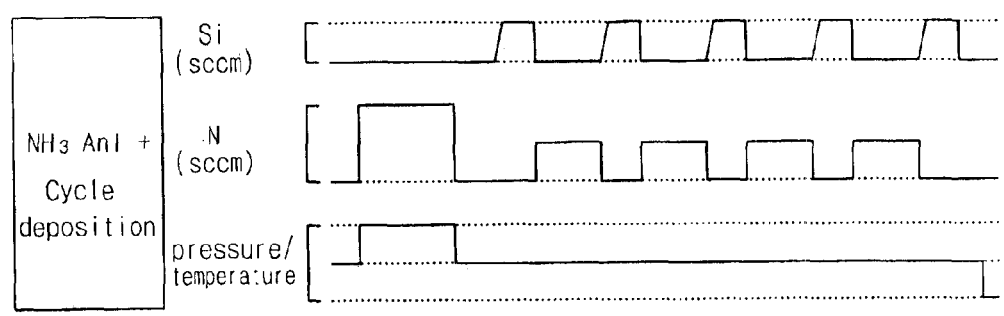
FIG. 3 is a schematic view showing a deposition system for a cyclic $Si_3N_4$ layer.

Further, gases such as $SiH_4$, $SiH_2Cl_2$, $SiCl_4$, etc., may be used as a silicon (Si) source employed in depositing the dielectric, and $NH_3$, $N_2$etc., may be used for a nitrogen (N) source, and $O_2$, $O_3$, $H_2O$, etc., may be used for an oxygen (O) source. As shown in FIG. 3, deposition of the $Si_3N_4$ on the storage node electrode is done through supplying such source gases to a reaction chamber periodically, forming a cyclic process.

As described above, although identical sources are used in depositing the $Si_3N_4$ through a cyclic process, as have been used in depositing the $Si_3N_4$ through a conventional LPCVD process, however, as shown in FIG. 3, supplying of the source gases are interrupted and then nitrogen source gases and silicon source gases are supplied to the reaction chamber in a pulse form thereby inducing the composition in the deposited thin layer to be enriched with nitrogen (N).

At this time, in the case of using $Si_3N_4$ as a dielectric layer, $Si_3N_4$ is deposited through a cycle composed of a silicon pulse and a nitrogen pulse. Further, in the case of using $SiO_xN_y$ (wherein x falls between 0.1 and 0.9 and y falls between 0.1 and 2) as a dielectric layer, it is deposited through a cycle composed of a silicon pulse and a nitrogen pulse and an oxygen pulse.

Meanwhile, it is possible to improve the leakage current and the dielectric characteristics by nitridation treatment the surface of the storage node electrode through an addition of a nitrogen pulse at a higher temperature or pressure than the deposition temperature or pressure prior to depositing the dielectric layer 27.

Then, the dielectric $Si_3N_4$ layer is deposited, and the surface thereof is oxidized to increase the insulating characteristics.

Subsequently, an oxidation process is performed and an amorphous silicon layer is deposited to form an upper electrode 29. At the time of depositing the amorphous silicon, doping is performed at above the solution limit or the phosphorous (P) concentration is enhanced through increase of the deposition pressure or implantation of phosphorous (P).

Further, in the case of depositing a silicon layer for use as an upper electrode, it is possible to use any one process selected from a group composed of a process of increasing the impurity concentration, a process of decreasing the deposition temperature, and a process of increasing the implanting pressure of the impurity source gas.

In the case of using a process of increasing the impurity concentration, a $DS(Si_2H_6)$ or a $MS(SiH_4)$ gas is used as a base gas at the time of deposition, and a $PH_3/H_2$ (or $PH_3/SiH_4$) gas having a concentration of 1 to 5% is used as an impurity source gas, and the pressure of the process is maintained at below 2 torr.

In the case of using a process of decreasing the deposition temperature, the process temperature is maintained at 500 to 570° C. in order to deposit the silicon in an amorphous state. At this time, the amounts of the gases used is 800 to 2000 ml (cc) of the base gas and 150 to 500 ml (cc) of the impurity gas.

Further, in the case of using a process of increasing an implanting pressure of the impurity source gas, the process temperature is maintained at 500 to 570° C. in order to deposit the silicon in an amorphous state. At this time, amounts of gases used is 1000 to 1500 ml (cc) of the base gas and 500 to 1500 ml (cc) of the impurity gas, and the pressure of the process is maintained at 1 to 2 torr.

Additionally, the process of deposition of the upper electrode comprises more than two steps, and the conditions of the process as described above are employed in the first step of the process. At this time, the thickness of the deposition is controlled to be 100 to 1000 Å.

Further, in the following process after the deposition of the upper electrode and ion implantation of P, the deposition temperature is increased to 550 to 600° C. in order to increase the speed of the deposition. At this time, the amount of the impurity source gas is decreased to below 300 ml (cc).

Table 1 shows test results of a case employing a $Si_3N_4$ layer deposited through the conventional LPCVD process and another case employing a $Si_3N_4$ layer deposited through a cyclic process according to the present invention.

As apparent from the table 1, the breakdown voltage (BV) of the layer fabricated in accordance with the present invention is higher than that of the conventional case by 0.35 to 0.5 V when applying identical charging capacities.

TABLE 1

| Classification | | $Si_3N_4$ layer (conventional) | $Si_3N_4$ layer (present invention) |
|---|---|---|---|
| BV(+) | Ave. | 3.69 | 4.24 |
| | Max. | 3.78 | 4.45 |
| | Min. | 3.65 | 4.08 |
| BV(−) | Ave. | −4.12 | −4.47 |
| | Max. | −4.10 | −4.33 |
| | Min. | −4.15 | −4.65 |

The results show that the charging capacity of the $Si_3N_4$ layer formed in accordance with the present invention is higher than that of the conventional case by 3 to 6 fF/cell in the case of identical breakdown voltages.

As described above, according to the method for fabricating a capacitor in a semiconductor device of the present invention, the deposited $Si_3N_4$ thin layer has an enriched nitrogen (N) composition as compared with the $Si_3N_4$ layer made through a CVD process, thereby increasing the oxidation resistance and dielectric ratio.

Accordingly, it is possible to reduce the thickness of the dielectric, thereby lowering the thickness $T_{eff}$ to below 40 Å and thus resulting in maximization of the charging capacity of the NO capacitor and a decrease in the height of the capacitor due to its high charging capacity. As a result, it is possible to perform sequential processes easily and to reduce the possibility of the occurrence of defects.

Also, the present invention obviates the necessity of purchasing high-priced equipment such as that used for ALD processes, and equipment such as that now in use in CVD processes can be used.

Therefore, according to the present invention, it is possible to improve the reliability and the refresh characteristics of the semiconductor device, due to its high charging capacity and low occurrence of defects.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor for a semiconductor device, comprising the steps of:
    forming a storage nodes electrode on a semiconductor wafer;
    forming a dielectric layer made of SiOxNy (wherein x falls between 0.1 and 0.9 and y falls between 0.1 and 2) on the surface of the storage node electrode in a cyclic process that introduces silicon source gas, nitrogen source gas, and oxygen source gas to the surface of the storage node electrode in absence of plasma pulses, wherein each source gas is introduced as a plurality of pulses and each plurality of pulses of the source gases is arranged in a predetermined order with respect to the other pluralities of pulses of other source gases; and
    forming an upper electrode on the dielectric layer.

2. The method for fabricating a capacitor according to claim 1 wherein the step of forming a storage node electrode comprises depositing an amorphous silicon layer having a low dopant concentration in an in-situ manner while keeping the semiconductor wafer in a reaction furnace and changing the amount of gas flow as soon the formation an amorphous silicon layer having a high dopant concentration in an in-situ manner is completed.

3. The method for fabricating a capacitor according to claim 1,
wherein the silicon (Si) source gas is $SiH_4$ gas, or $SIH_2Cl_2$ gas or $SiCl_4$ gas,
wherein the nitrogen (N) source gas is $NH_3$ gas or $N_2$ gas, and
wherein the oxygen (O) source gas is $O_2$, or $O_3$, or $H_2O$.

4. The method for fabricating a capacitor according to claim 1, further comprising a step of performing a nitridation treatment of the surface of the storage node electrode by adding a plurality of nitrogen (N) pulses to the cyclic process, wherein the plurality of nitrogen pulses are added under a higher temperature or pressure than the deposition temperature or pressure prior to the formation of the dielectric layer.

5. The method for fabricating a capacitor according to claim 1, further comprising a step of oxidizing the surface of the dielectric layer after the formation of the dielectric layer.

6. The method for fabricating a capacitor according to claim 1, wherein the upper electrode is formed by depositing silicon through any one process selected from a group composed of increasing the impurity concentration, lowering the deposition temperature, and increasing implantation pressure of the impurity source.

7. The method for fabricating a capacitor according to claim 6, wherein the process of increasing the impurity concentration is performed while using a DS ($SI_2H_6$) or a MS ($SIH_4$) as a deposition gas and $PH_3/H_2$(or a $PH_3/SiH_4$) gas having a concentration of 1 to 5% as an impurity source gas, and at a process pressure of below 2 torr.

8. The method for fabricating a capacitor according to claim 6, wherein the process of lowering the deposition temperature is performed at a temperature of 500 to 570 ° C. while using base gas in an amount of 800 to 2000 ml (cc) and impurity gas in an amount of 150 to 500 ml (cc).

9. The method for fabricating a capacitor according to claim 6, wherein the process of increasing the implatation pressure of the impurity source is performed at a temperature of to 570 ° C. while using base gas in an amount of 1000 to 1500 ml (cc) and impurity gas in an amount of 500 to 1500 ml (cc), and at a process pressure of 1 to 2 torr.

10. The method for fabricating a capacitor according to claim 1, wherein phosphorous is implanted after the formation of the upper electrode.

11. The method for fabricating a capacitor according to claim 1, wherein the formation of the upper electrode is performed through more than two steps, and the deposition thickness of the first step is 100 to 1000 Å.

12. The method for fabricating a capacitor according to claim 11, wherein the deposition temperature of the succeeding process after a second step is increased to 550 to 600 ° C.

13. The method for fabricating a capacitor according to claim 12, wherein the impurity gas is used in an amount of below 300 ml.

* * * * *